(12) United States Patent
Cheng et al.

(10) Patent No.: US 9,839,121 B2
(45) Date of Patent: Dec. 5, 2017

(54) ELECTRONIC DEVICE AND DYNAMIC RANDOM ACCESS MEMORY THEREOF

(71) Applicant: ALSON TECHNOLOGY LIMITED, Kowloon OT (HK)

(72) Inventors: Han-Hung Cheng, Zhubei (TW); Chi-Fen Kuo, Zhubei (TW)

(73) Assignee: ALSON TECHNOLOGY LIMITED, Kowloon (HK)

( * ) Notice: Subject to any disclaimer, the term of this patent is extended or adjusted under 35 U.S.C. 154(b) by 67 days.

(21) Appl. No.: 14/940,865

(22) Filed: Nov. 13, 2015

(65) Prior Publication Data
US 2017/0142827 A1    May 18, 2017

(51) Int. Cl.
| | |
|---|---|
| F21S 6/00 | (2006.01) |
| H05K 1/02 | (2006.01) |
| H05K 3/28 | (2006.01) |
| H05K 1/18 | (2006.01) |

(52) U.S. Cl.
CPC .......... *H05K 1/0274* (2013.01); *H05K 3/284* (2013.01); *H05K 1/181* (2013.01); *H05K 2201/10106* (2013.01); *H05K 2201/10159* (2013.01)

(58) Field of Classification Search
CPC .... H05K 1/0274; H05K 1/0204; H05K 1/181; H05K 2201/10106; H05K 2201/10159; F21V 29/70
USPC .......................... 362/373, 622, 109, 244, 458
See application file for complete search history.

(56) References Cited

U.S. PATENT DOCUMENTS 7,542,302 B1 *  6/2009  Curnalia .............. H05K 1/0274
                                                       174/255

FOREIGN PATENT DOCUMENTS

| CN | 203378153 U | * | 1/2014 |
| TW | M448772 U | | 3/2013 |

OTHER PUBLICATIONS

Machine English Translation of TWM448772(U) Mar. 11, 2013.*

* cited by examiner

*Primary Examiner* — Elmito Breval
*Assistant Examiner* — Glenn Zimmerman
(74) *Attorney, Agent, or Firm* — Muncy, Geissler, Olds & Lowe, P.C.

(57) ABSTRACT

A dynamic random access memory includes a main body, a light-emitting portion and a transmission port, the main body has a substrate and a first coating layer, the substrate has a light-transmittable portion and a first face, the first coating layer is coated on the first face, the first coating layer has an emergent light-transmittable portion corresponding to the light-transmittable portion, and the substrate is provided with a memory module. The light-emitting portion is embedded in the substrate. The transmission port is disposed on the substrate and electrically connected with the memory module. The electronic device includes the dynamic random access memory and further includes a shell portion. The shell portion is covered on two opposite lateral faces of the dynamic random access memory, and the shell portion further has a second light-transmittable portion corresponding to the emergent light-transmittable portion.

9 Claims, 4 Drawing Sheets

ELECTRONIC DEVICE AND DYNAMIC RANDOM ACCESS MEMORY THEREOF

BACKGROUND OF THE INVENTION

Field of the Invention

The present invention relates to an electronic device and a dynamic random access memory thereof.

Description of the Prior Art

An electronic device and a dynamic random access memory thereof as disclosed in TWM448772 include a main body, at least one light-emitting diode and at least one translucent light-guiding body. The light-emitting diode is disposed in the main body and electrically connected with the main body, the main body is provided with a memory module, the light-guiding body is disposed on the main body and covers the light-emitting diode, and light from the light-emitting diode can penetrate through the light-guiding body.

However, when this type of the electronic device and the dynamic random access memory thereof is in actual practice, the light-guiding body needs to be further covered on the light-emitting diode; therefore, the electronic device is too thick, and the manufacturing cost is higher.

The present invention has arisen to mitigate and/or obviate the afore-described disadvantages.

SUMMARY OF THE INVENTION

The major object of the present invention is to provide an electronic device and a dynamic random access memory thereof, wherein light is emitted through a light-emitting portion embedded in a substrate and an emergent light-transmittable portion of a coating layer without a light-guiding portion which needs to be further disposed. Therefore, a thickness of the present invention decreases, and a manufacturing cost of the present invention is lower.

To achieve the above and other objects, a dynamic random access memory is provided, including a main body, a light-emitting portion and a transmission port. The main body includes a substrate and a first coating layer, the substrate has a light-transmittable portion and a first face, the first coating layer is coated on the first face, the first coating layer is formed with an emergent light-transmittable portion corresponding to the light-transmittable portion, the substrate is further provided with a memory module. The light-emitting portion is embedded in the substrate, and light from the light-emitting portion can be projected to the light-transmittable portion and projected through the emergent light-transmittable portion to an exterior of the dynamic random access memory. The transmission port is disposed on the substrate and electrically connected with the memory module.

To achieve the above and other objects, an electronic device is further provided, including the dynamic random access memory mentioned above, and further including a shell portion. The shell portion is covered on two opposite lateral faces of the dynamic random access memory. The shell portion further has a second light-transmittable portion corresponding to the emergent light-transmittable portion, and light projected from the emergent light-transmittable portion can be projected through the second light-transmittable portion to an exterior of the electronic device.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
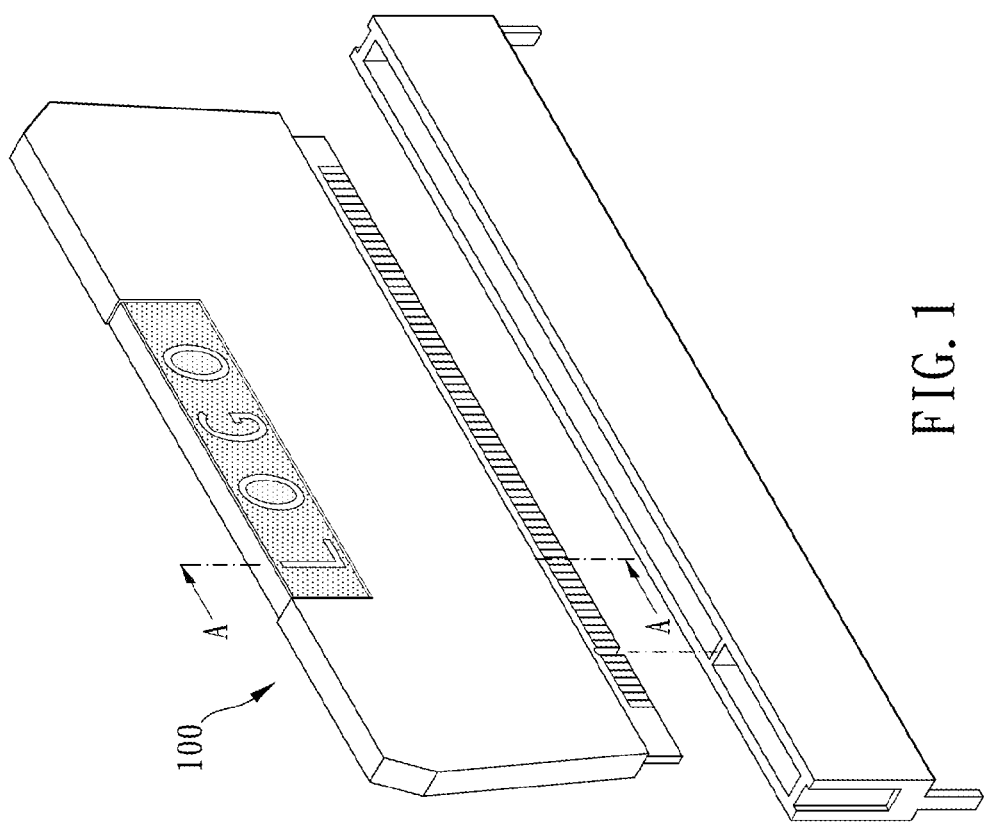
FIG. 1 is a perspective view of a preferred embodiment of the present invention.
Figure 2:
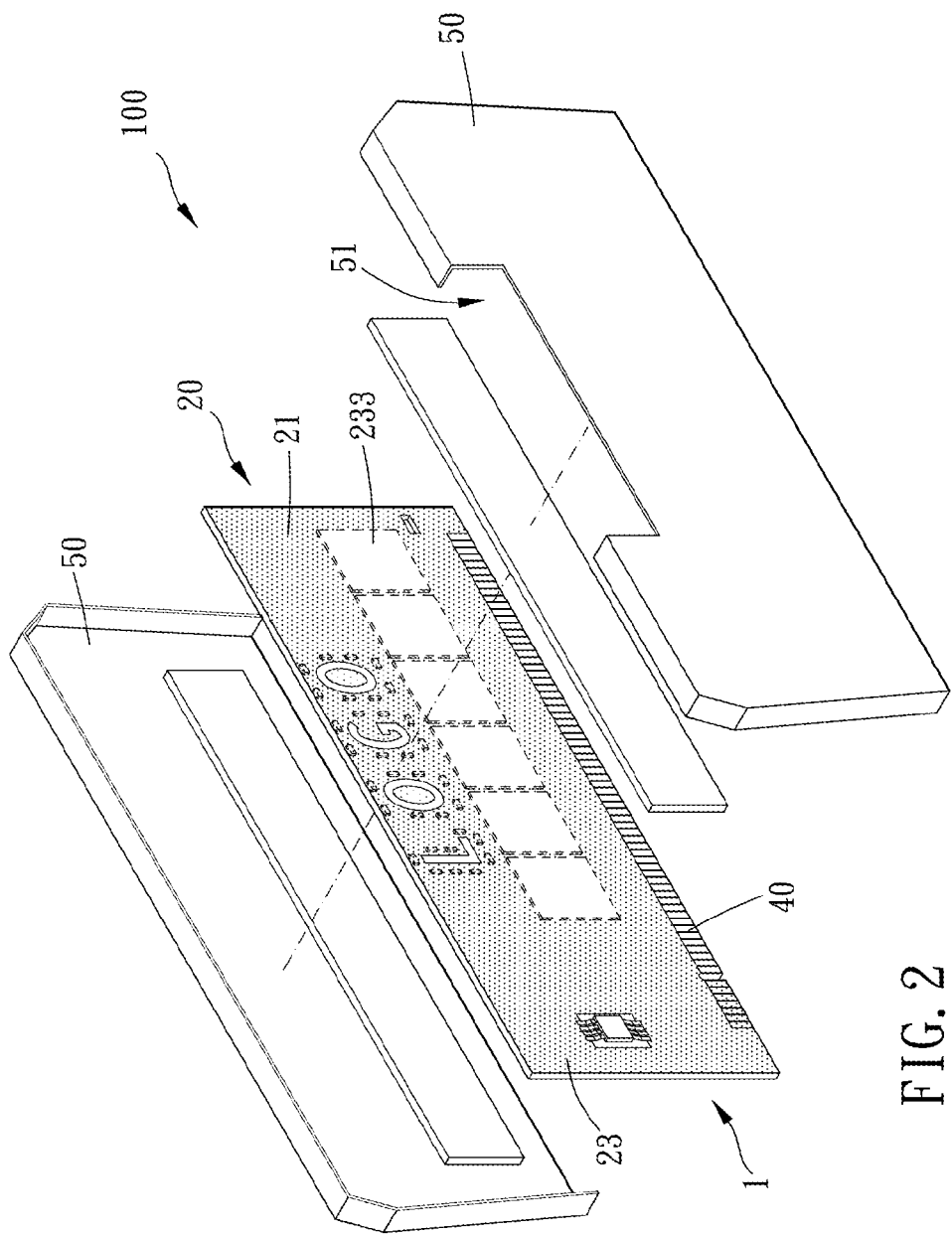
FIG. 2 is a breakdown view of the preferred embodiment of the present invention.
Figure 3:
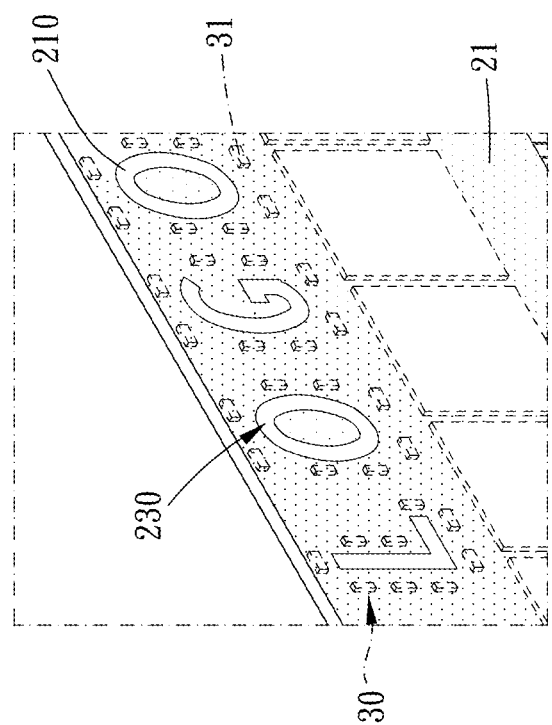
FIG. 3 is a partially-enlarged view of the preferred embodiment of the present invention.
Figure 4:
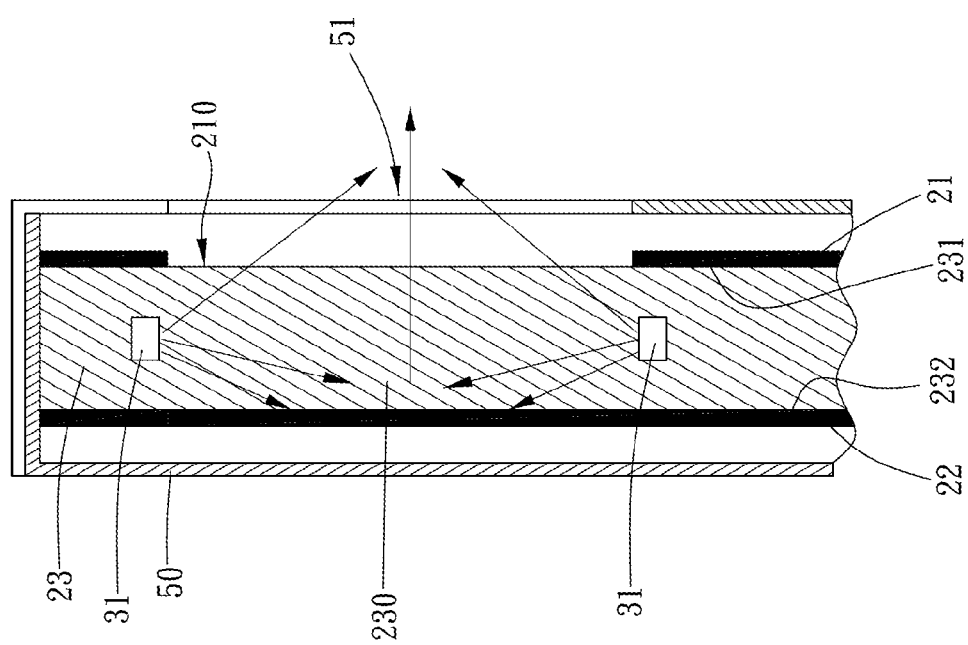
FIG. 4 is a cross-sectional view of the present invention, taken along line A-A in FIG. 1.

Please refer to FIGS. 1 to 4 for an electronic device 100 and a dynamic random access memory 1 thereof of a preferred embodiment of the present invention. The dynamic random access memory 1 includes a main body 20, a light-emitting portion 30 and a transmission port 40.

The main body 20 includes a substrate 23 and a first coating layer 21. Specifically, the substrate 23 has a light-transmittable portion 230 and a first face 231, the first coating layer 21 is coated on the first face 231, the first coating layer 21 has an emergent light-transmittable portion 210 corresponding to the light-transmittable portion 230. In this embodiment, the first coating layer 21 at least shields a part of the light-emitting portion 30. Specifically, the first coating layer 21 shields the light-emitting portion 30 thoroughly, the light from the light-emitting portion 30 is guided (refracted or reflected) through the light-transmittable portion 230 and transmitted to the emergent light-transmittable portion 210 so that the light projected is softer. In other embodiments, the light-emitting portion may be not shielded by the first coating layer and be arranged facing the emergent light-transmittable portion; or, the light-emitting portion is partially shielded.

The light-emitting portion 30 is embedded in the substrate 23, and the light from the light-emitting portion 30 can be projected to the light-transmittable portion 230 and projected through the emergent light-transmittable portion 210 to an exterior of the dynamic random access memory 1. It is to be noted that the substrate 23 is a translucent board of a normal printed circuit board. In other embodiments, the light-transmittable portion may be a layer made of a light-transmittable material, and other parts of the substrate may be a layer made of a light-nontransmittable material so that a light-emitting face of the light-emitting portion (which may be partially embedded in the layer made of the light-nontransmittable material) faces the light-transmittable portion directly to emit light; or, the light-transmittable portion is a hollow-out structure, and the light-emitting face of the light-emitting portion is exposed through the hollow-out structure.

The substrate 23 is provided with a memory module 233, the transmission port 40 is disposed on the substrate 23, and the transmission port 40 is electrically connected with the memory module 233. More specifically, the light-emitting portion 30 is also electrically connected with the transmission port 40 (of course, the light-emitting portion may be further electrically connected with other exterior powers such as a mother board). It is understandable that the transmission port 40 can transmit not only electricity but also data.

In this embodiment, the substrate 23 has a second face 232 opposite to the first face 231, the main body 20 includes a second coating layer 22 coated on the second face 232, and the second coating layer 22 at least shields a part of the light-emitting portion 30 (the second coating layer may also not shield the light-emitting portion and allow the light to penetrate directly).

In this embodiment, the first coating layer 21 and the second coating layer 22 are insulting coating layers of a normal circuit board. The emergent light-transmittable portion 210 is a hollow-out structure which is not coated. In other embodiments, the emergent light-transmittable portion may be a layer made of a light-transmittable material. Specifically, the emergent light-transmittable portion 210 is a light-transmittable pattern portion (for example, a trademark) so that the present invention is more appealing when being viewed from outside.

Specifically, the light-emitting portion 30 includes a plurality of light-emitting diodes 31 which are embedded in the substrate 23 along a contour of the emergent light-transmittable portion 210 so that light projected from the emergent light-transmittable portion 210 is brighter and more even.

The electronic device 100 includes the dynamic random access memory 1 mentioned above and further includes a shell portion 50.

The shell portion 50 is covered on two opposite lateral faces of the dynamic random access memory 1. The shell portion 50 further has a second light-transmittable portion 51 corresponding to the emergent light-transmittable portion 210, and the light projected from the emergent light-transmittable portion 210 can be projected through the second light-transmittable portion 51 to an exterior of the electronic device 100. It is understandable that the second light-transmittable portion 51 may be a hollow-out structure or a layer made of a light-transmittable material.

In this embodiment, the shell portion 50 is a heat-dissipating shell portion (the shell portion may made of, for example, a metal) to prevent the dynamic random access memory 1 from overheating.

Given the above, the electronic device and the dynamic random access memory thereof, wherein light is emitted through the light-emitting portion embedded in the substrate and the emergent light-transmittable portion of the coating layer without a light-guiding portion which needs to be further disposed. Therefore, a thickness of the present invention decreases, and a manufacturing cost of the present invention is lower.

While we have shown and described various embodiments in accordance with the present invention, it should be clear to those skilled in the art that further embodiments may be made without departing from the scope of the present invention.

What is claimed is:

1. A dynamic random access memory, including:
   a main body, including a substrate which is a single translucent board of a printed circuit board and a first coating layer, the substrate having a light-transmittable portion which is integrally formed as a part of the single translucent board and a first face, the first coating layer being coated on the first face, the first coating layer being formed with an emergent light-transmittable portion corresponding to the light-transmittable portion, the substrate being provided with a memory module;
   a light-emitting portion, embedded in the substrate, light from the light-emitting portion being projectable to the light-transmittable portion and projectable through the emergent light-transmittable portion to an exterior of the dynamic random access memory;
   a transmission port, disposed on the substrate and electrically connected with the memory module; and
   wherein the first coating layer is thinner than the substrate and thinner than the light-emitting portion.

2. The dynamic random access memory of claim 1, wherein the first coating layer at least shields a part of the light-emitting portion.

3. The dynamic random access memory of claim 1, wherein the substrate further has a second face opposite to the first face, the main body further includes a second coating layer coated on the second face, and the second coating layer at least shields a part of the light-emitting portion.

4. The dynamic random access memory of claim 1, wherein the light-emitting portion includes a plurality of light-emitting diodes which are embedded in the substrate along a contour of the emergent light-transmittable portion.

5. The dynamic random access memory of claim 1, wherein the emergent light-transmittable portion is a hollow-out structure or a layer made of a light-transmittable material.

6. An electronic device, including the dynamic random access memory of claim 1, further including:
   a shell portion, covered on two opposite lateral faces of the dynamic random access memory, the shell portion having a second light-transmittable portion corresponding to the emergent light-transmittable portion, and light projected from the emergent light-transmittable portion being projectable through the second light-transmittable portion to an exterior of the electronic device.

7. The dynamic random access memory of claim 4, wherein the emergent light-transmittable portion is a light-transmittable pattern portion.

8. The electronic device of claim 6, wherein the second light-transmittable portion is a hollow-out structure or a layer made of a light-transmittable material.

9. The electronic device of claim 6, wherein the shell portion is a heat-dissipating shell portion.

* * * * *